US009362014B2

(12) United States Patent
Nakanishi et al.

(10) Patent No.: US 9,362,014 B2
(45) Date of Patent: Jun. 7, 2016

(54) PLATE-LIKE ELECTRIC CONDUCTOR FOR A BUSBAR AND THE BUSBAR FORMED THEREFROM

(71) Applicant: UACJ Corporation, Tokyo (JP)

(72) Inventors: Hidetaka Nakanishi, Nagoya (JP); Mineo Asano, Nagoya (JP); Hiroki Tanaka, Osaka (JP)

(73) Assignee: UACJ Corporation, Tokyo (JP)

( * ) Notice: Subject to any disclaimer, the term of this patent is extended or adjusted under 35 U.S.C. 154(b) by 0 days.

(21) Appl. No.: 14/243,228

(22) Filed: Apr. 2, 2014

(65) Prior Publication Data

US 2014/0209350 A1 Jul. 31, 2014

Related U.S. Application Data

(63) Continuation of application No. PCT/JP2013/073098, filed on Aug. 29, 2013.

(30) Foreign Application Priority Data

Oct. 11, 2012 (JP) ................................ 2012-225756

(51) Int. Cl.

| | |
|---|---|
| ***H05K 1/09*** | (2006.01) |
| ***H01B 5/00*** | (2006.01) |
| ***H01B 1/02*** | (2006.01) |
| ***C22C 21/00*** | (2006.01) |
| ***C22F 1/04*** | (2006.01) |
| ***C22C 21/02*** | (2006.01) |
| ***C22C 21/08*** | (2006.01) |
| ***H01B 5/02*** | (2006.01) |
| ***C22F 1/043*** | (2006.01) |
| *C22C 9/00* | (2006.01) |

(52) U.S. Cl.
CPC ................ *H01B 1/023* (2013.01); *C22C 21/00* (2013.01); *C22C 21/02* (2013.01); *C22C 21/08* (2013.01); *C22F 1/04* (2013.01); *C22F 1/043* (2013.01); *H01B 5/02* (2013.01); *C22C 9/00* (2013.01)

(58) Field of Classification Search
CPC ............ C23C 2/02; C23C 2/28; C23C 26/02; H05K 1/092; H05K 1/095; H05K 3/244; C22C 21/00; C22C 21/02; C22C 21/08; C22C 9/00; C22F 1/04; C22F 1/043; H01B 1/023; H01B 5/02
USPC ........................... 174/256, 257, 126.1–126.2
See application file for complete search history.

(56) References Cited

U.S. PATENT DOCUMENTS

| | | | | |
|---|---|---|---|---|
| 2010/0072584 | A1* | 3/2010 | Aruga et al. | 257/666 |
| 2011/0266029 | A1* | 11/2011 | Sekiya et al. | 174/126.1 |
| 2011/0272175 | A1* | 11/2011 | Sekiya et al. | 174/128.1 |
| 2012/0094553 | A1 | 4/2012 | Fujiwara et al. | |
| 2012/0241193 | A1* | 9/2012 | Shinoda | 174/126.2 |
| 2012/0321889 | A1* | 12/2012 | Sekiya et al. | 428/372 |
| 2013/0269842 | A1 | 10/2013 | Seki et al. | |
| 2013/0302676 | A1* | 11/2013 | Seki et al. | 429/211 |
| 2013/0323589 | A1* | 12/2013 | Yamaguchi et al. | 429/211 |

FOREIGN PATENT DOCUMENTS

| | | | |
|---|---|---|---|
| JP | 61-119659 | A1 | 6/1986 |
| JP | 01-255637 | A1 | 10/1989 |
| JP | 2004-339559 | A1 | 12/2004 |
| JP | 2009-238831 | A1 | 10/2009 |
| JP | 2011-019385 | A1 | 1/2011 |
| WO | 2012/086448 | A1 | 6/2012 |
| WO | WO2012/086447 | A1 | 6/2012 |

OTHER PUBLICATIONS

International Search Report (Application No. PCT/JP2013/073098) dated Oct. 29, 2013 (with English translation).
Korean Office Action, Korean Application No. 10-2014-7013495, dated May 28, 2015 (4 pages).
Office Action from a corresponding Chinese patent application (No. 201380004118.5) bearing a mailing date of Jun. 1, 2015, 6 pages.

* cited by examiner

*Primary Examiner* — Hoa C Nguyen
(74) *Attorney, Agent, or Firm* — Burr & Brown, PLLC

(57) ABSTRACT

A plate-like electric conductor for a busbar having excellent electric conductivity, strength and bendability, and a busbar formed therefrom.
The electric conductor formed from an aluminum alloy plate having a thickness of 0.5-12 mm is obtained by subjecting an aluminum alloy consisting essentially of Fe: 0.05-2.0%; Si: 0.05-0.6%; Cu: 0.01-0.35%; by mass, and the balance comprising Al and inevitable impurities to a hot rolling process. The electric conductor has the electric conductivity of 55-60% IACS, tensile strength not lower than 170 MPa and yield strength not lower than 155 MPa, in the as-rolled state at the room temperature, and does not suffer from cracking upon bending by 90° with an inner bending radius equal to its thickness, while having the electric conductivity of 55-60% IACS, tensile strength not lower than 160 MPa, and yield strength not lower than 145 MPa, after a heat treatment at 140-160° C. for not longer than 1,000 hours.

7 Claims, No Drawings

PLATE-LIKE ELECTRIC CONDUCTOR FOR A BUSBAR AND THE BUSBAR FORMED THEREFROM

This application is a continuation of the International Application No. PCT/JP2013/073098, filed Aug. 29, 2013, which claims the benefit under 35 U.S.C. §119(a)-(d) of Japanese Application No. 2012-225756, filed Oct. 11, 2012, the entireties of which are incorporated herein by reference.

BACKGROUND OF THE INVENTION

1. Field of the Invention

The present invention relates generally to a plate-like electric conductor for a busbar and a busbar formed therefrom, and more particularly to a plate-like electric conductor for a busbar, which has high degrees of electric conductivity, strength and bendability, and a busbar consisting of the electric conductor having such properties.

2. Discussion of Related Art

Plates made of a pure copper material having a high degree of electric conductivity such as oxygen-free copper, tough pitch copper and phosphorus-deoxidized copper are conventionally used for an electric conductor for a busbar employed for a power control unit (PCU) for bullet train (Shinkansen) cars, linear motor cars and hybrid motor cars. Plates made of a copper alloy material having a high degree of electric conductivity and subjected to Ni electroplating are used when the electric conductor is required to have a higher degree of strength. However, costs of the copper and copper alloy materials are rising along with a recent increase of resource costs. Also, the copper and copper alloy materials have relatively heavy weights and are not preferred for components of vehicles, which are required to have reduced weights to improve fuel economy of the vehicles. Therefore, an alternative material having a lighter weight and a lower cost is desired for the electric conductor. Further, the Ni electroplating has a potential problem of a high cost.

In view of the above-described problems, aluminum (Al) has been attracting attention as an alternative material for the electric conductor for the busbar, owing to its low cost and contribution to reduction of weight. Among aluminum materials having an industrial pure level, A1060 aluminum material according to JIS is advantageously used since this material is considered to be particularly effective to achieve an electric conductivity of 61% IACS, as disclosed in JP-A-2011-19385, for example. Further, a 6,000 series aluminum alloy material such as A6061 aluminum alloy material according to JIS or ISO is used when the electric conductor is required to have a higher degree of strength, as disclosed in JP-A-2011-19385 and JP-A-2009-238831, for example.

There is a recent demand for a busbar which can be formed into a complex shape so as to be adapted to a surrounding environment in which the busbar is to be installed. Therefore, the busbar is required to have a high degree of bendability as well as high degrees of electric conductivity and strength. However, the conventional electric conductors for the busbar made of a pure aluminum material or an aluminum alloy material have problems that the electric conductor satisfying some required degrees of electric conductivity and bendability cannot have a sufficiently high degree of strength, while the electric conductor satisfying some required degrees of electric conductivity and strength cannot have a sufficiently high degree of bendability. Thus, the conventional electric conductors cannot satisfy required degrees of all of the electric conductivity, strength and bendability. This results from mutually contradictory requirements for achieving these properties, namely, it is preferable to precipitate solute components in the aluminum or aluminum alloy as much as possible in order to achieve the sufficiently high degrees of electric conductivity and bendability, while at the same time it is preferable to prevent the precipitation of the solute components as far as possible in order to achieve the sufficiently high degree of strength owing to a solute effect.

SUMMARY OF THE INVENTION

The present invention was made in light of the background art described above. It is therefore a problem to be solved by the present invention to provide a plate-like electric conductor for a busbar, which has high degrees of electric conductivity, strength and bendability, and a busbar consisting of the electric conductor having such properties.

The above-described problem can be solved according to the principle of the present invention, which provides a plate-like electric conductor for a busbar formed from an aluminum alloy plate having a thickness (T) of 0.5-12 mm obtained by using an aluminum alloy consisting essentially of 0.05-2.0% by mass of Fe, 0.05-0.6% by mass of Si, 0.01-0.35% by mass of Cu, and a balance comprising Al and inevitable impurities, and subjecting the aluminum alloy to a hot rolling process so as to obtain the plate-like electric conductor having an electric conductivity of 55-60% IACS, in an as-rolled state at the room temperature, wherein the plate-like electric conductor has a tensile strength not lower than 170 MPa and a yield strength not lower than 155 MPa, in the as-rolled state at the room temperature, and the plate-like electric conductor does not suffer from cracking when the plate-like electric conductor is bent by 90° with an inner bending radius equal to the above-described thickness (T), and wherein the plate-like electric conductor has the electric conductivity of 55-60% IACS, the tensile strength not lower than 160 MPa, and the yield strength not lower than 145 MPa, at the room temperature, after a heat treatment in which the plate-like electric conductor is held at a temperature of 140-160° C. for not longer than 1,000 hours.

According to one preferred form of the plate-like electric conductor for the busbar of the present invention, the aluminum alloy contains 0.1-1.6% by mass of Fe. According to another preferred form of the present invention, the aluminum alloy contains 0.05-0.5% by mass of Si. According to a further preferred form of the present invention, the aluminum alloy contains 0.05-0.30% by mass of Cu.

According to a further preferred form of the present invention, the aluminum alloy contains not more than 0.15% by mass of the inevitable impurities.

According to a yet further preferred form of the present invention, the aluminum alloy plate has the thickness of 0.5-8 mm.

The present invention also provides a busbar consisting of the above-described plate-like electric conductor.

The plate-like electric conductor for the busbar according to this invention is formed from an aluminum alloy plate having a predetermined thickness which is obtained by using an aluminum alloy containing specific amounts of Fe, Si and Cu, and subjecting the aluminum alloy to a hot rolling process such that the plate-like electric conductor to be obtained has an electric conductivity of 55-60% IACS in the as-rolled state at the room temperature. As a result, solute components in the aluminum alloy are allowed to be present as precipitates and solutes in a solid solution, in a well-balanced state, whereby the plate-like electric conductor can advantageously have excellent properties of high degrees of tensile strength and yield strength in the as-rolled state at the room temperature, and does not suffer from cracking even when the plate-like electric conductor is bent by 90° with an inner bending radius equal to its thickness T. Further, the plate-like electric conductor can advantageously maintain its excellent properties of high degrees of electric conductivity, tensile strength and yield strength, even after the plate-like electric conductor is continuously used as the busbar and subjected to the Joule heat. Thus, this invention can provide a plate-like electric conductor which is excellent in all of its electric conductivity, strength and bendability, and a busbar consisting of the plate-like electric conductor.

Further, the plate-like electric conductor for the busbar according to this invention is generally formed of an aluminum alloy, so that the plate-like electric conductor according to this invention has a lighter weight and a lower cost than the conventional copper material for the busbar.

In the production of the plate-like electric conductor for the busbar according to this invention, an ingot of a suitable aluminum alloy is subjected to a hot rolling process under specific conditions. Accordingly, solute components in the aluminum alloy are allowed to be present as precipitates and solutes in a solid solution, in a well-balanced state, whereby the above-described excellent properties are effectively imparted to the plate-like electric conductor for the busbar to be obtained.

DETAILED DESCRIPTION OF THE INVENTION

A plate-like electric conductor for a busbar according to this invention is formed from an aluminum alloy plate having a thickness (T) of 0.5-12 mm obtained by using an aluminum alloy consisting essentially of 0.05-2.0% by mass of Fe (iron), 0.05-0.6% by mass of Si (silicon), 0.01-0.35% by mass of Cu (copper), and a balance comprising Al (aluminum) and inevitable impurities.

Fe is an essential element of the aluminum alloy giving the aluminum alloy plate, and serves to increase the strength of the electric conductor and to reduce the size of crystal grains. If the Fe content is less than 0.05% (by mass: hereinafter "by mass" being omitted), the effect of increasing the strength of the electric conductor cannot be exhibited. If the Fe content is more than 2.0%, Al—Fe—Si-based and Al—Fe-based crystallized products and precipitates are formed, giving rise to problems such as reduction of the bendability of the electric conductor. Therefore, the Fe content is required to be held within a range of 0.05-2.0%, preferably 0.1-1.6%.

Si is an element which serves to increase the strength of the electric conductor and to reduce the size of the crystal grains, like the above-described Fe. if the Si content is less than 0.05%, the effect of increasing the strength of the electric conductor is difficult to be exhibited. If the Si content is more than 0.6%, Al—Fe—Si-based crystallized products and precipitates of Si are formed, giving rise to problems such as reduction of the bendability of the electric conductor. Therefore, the Si content is required to be held within a range of 0.05-0.6%, preferably 0.05-0.5%.

Cu is an element which serves to increase the strength of the electric conductor and to prevent reduction of this strength when the electric conductor is used as the busbar and subjected to a high-temperature thermal hysteresis due to Joule heat. If the Cu content is less than 0.01%, the effect of increasing the strength of the electric conductor cannot be sufficiently exhibited, giving rise to problems such as difficulty to prevent the reduction of the strength of the electric conductor after the electric conductor is subjected to the high-temperature thermal hysteresis. On the other hand, if the Cu content is more than 0.35%, the electric conductivity of the electric conductor is reduced, and a shear band is likely to be formed in a bending process of the electric conductor, giving rise to problems of deterioration of the bendability of the electric conductor, for example. Therefore, the Cu content is required to be held within a range of 0.01-0.35%, preferably 0.05-0.30%.

The aluminum alloy according to this invention consists essentially of the above-described specific amounts of Fe, Si and Cu, and the balance comprising aluminum and inevitable impurities. The inevitable impurities are known elements such as Mn, Mg, Cr, Zn, Ni, Ga, V and Ti, the amounts of which are adjusted so as to be minimized. In general, the amount of each of the inevitable impurities is adjusted so as to be preferably not more than 0.05%, and a total amount of the inevitable impurities is adjusted so as to be generally not more than 0.15%, and preferably not more than 0.10%.

The plate-like electric conductor for the busbar according to this invention is obtained by forming the above-described aluminum alloy into an aluminum alloy plate having the thickness (T) of 0.5-12 mm by a hot rolling process. A hot rolling operation is conducted such that the electric conductor to be obtained has the electric conductivity of 55-60% IACS in the as-rolled state at the room temperature. By conducting the hot rolling operation so as to obtain the above-described range of electric conductivity, solute components in the aluminum alloy are effectively allowed to be present as precipitates and solutes in a solid solution, in a well-balanced state, whereby the electric conductor to be obtained can exhibit excellent properties. If the electric conductivity is lower than 55% IACS, there arises a problem that the electric conductor cannot serve as a sufficiently highly conductive member, and has difficulty to function as the busbar. Also, there arise other problems that the electric conductor cannot have a sufficiently high degree of bendability, for example. On the other hand, an electric conductivity higher than 60% IACS causes the strength or other properties of the electric conductor to be deteriorated even though the electric conductor has desired degrees of electric conductivity and bendability. Here, the electric conductivity is expressed as an IACS (International Annealed Copper Standard) value at 20° C. More specifically described, the electric conductivity is expressed as a percentage (% LAGS) value obtained by comparison with a standard value of the electric conductivity of annealed copper, provided that the specific resistance of 1.7241 μΩcm of the annealed copper is defined as 100% IACS.

The thickness (T) of the thus obtained aluminum alloy plate has influences on the electric conductivity required for the busbar and the weight of the busbar, so that the thickness (T) is held within a range of 0.5-12 mm, preferably 0.5-8 mm. If the thickness (T) is less than 0.5 mm, the electric conductor has a reduced cross sectional surface area per unit width, giving rise to problems of reduction of its electric conductivity, and its difficulty to function as the busbar. If the thickness (T) is more than 12 mm, the electric conductor has an increased weight per unit width, so that it is difficult to achieve an advantage (weight reduction effect) of using the electric conductor as an alternative to the conventional busbar made of a copper material.

The plate-like electric conductor for the busbar formed from the thus obtained aluminum alloy plate has a tensile strength not lower than 170 MPa and a yield strength not lower than 155 MPa, in the as-rolled state at the room temperature, and does not suffer from cracking when the electric conductor is bent by 90° with an inner bending radius equal to its thickness (T). These material properties are properties required right after the beginning of the use of the electric conductor as the busbar, and also required in order to effectively perform a bending process in the production of the busbar. If the plate-like electric conductor has a tensile strength lower than 170 MPa or a yield strength lower than 155 MPa, in the as-rolled state at the room temperature, the plate-like electric conductor is difficult to be used as the alternative to the conventional busbar made of a copper material. The aluminum alloy plate (plate-like electric conductor) does not suffer from cracking when it is bent by 90° with the inner bending radius (T) equal to its thickness (T), On the other hand, if cracking takes place when the aluminum alloy plate is bent by 90°, there arises a risk of failure to produce the busbar from the aluminum alloy plate.

The plate-like electric conductor for the busbar formed from the above-described aluminum alloy plate has excellent properties even after the plate-like electric conductor is subjected to an accelerating test which is conducted to give the plate-like electric conductor a high-temperature thermal hysteresis based on the Joule heat to simulate its continuous use as the busbar. When the plate-like electric conductor is used as the busbar, heat of about 100-120° C. is generated by the Joule heat. Accordingly, the accelerating test is conducted by performing a heat treatment of the plate-like electric conductor at a temperature of 140-160° C. for not longer than 1,000 hours (and longer than 0 hour), in order to examine deterioration of the properties of the plate-like electric conductor due to the thermal hysteresis. After the accelerating test, the plate-like electric conductor has an electric conductivity of 55-60% IACS, a tensile strength not lower than 160 MPa and a yield strength not lower than 145 MPa, at the room temperature.

If the plate-like electric conductor has the electric conductivity lower than the above-described lower limit after it is subjected to the above-described heat treatment (accelerating test) at 140-160° C. for not longer than 1,000 hours, the plate-like electric conductor cannot serve as a sufficiently highly conductive member, and has difficulty to function as the busbar. On the other hand, if the plate-like electric conductor has the electric conductivity higher than the above-described upper limit after the accelerating test, the strength of the plate-like electric conductor is excessively deteriorated, giving rise to problems in the continuous use of the plate-like electric conductor as the busbar. Further, if the tensile strength or yield strength of the plate-like electric conductor after the accelerating test is lower than the above-described lower limits, the plate-like electric conductor cannot be used as the alternative to the conventional busbar made of a copper material.

In order to enable the above-described Al—Fe—Si—Cu-based alloy according to this invention to have the high degrees of electric conductivity and bendability, in the as-rolled state and after the heat treatment at 140-160° C., solute components in the aluminum alloy are required to be precipitated as much as possible. On the other hand, in order to enable the above-described Al—Fe—Si—Cu-based alloy to have the high degree of strength, in the as-rolled state and after the heat treatment at 140-160° C., prevention of the precipitation of the solute components in the aluminum alloy is required as far as possible in order to increase the strength of the aluminum alloy owing to a solute effect. Thus, the high degrees of the above-described two properties can be achieved by realizing mutually contradictory behaviors and acquiring an appropriate balance between the contradictory behaviors, namely, by precipitating a portion of the solute components in the aluminum alloy while maintaining another portion of the solute components in the state of the solid solution.

In order to achieve the above-described properties, a production method as described below is advantageously employed in this invention.

Generally, an ingot of an aluminum alloy obtained by a DC casting process or the like is subjected to a homogenization heat treatment, i.e. a homogenization treatment, at a temperature of 450-630° C., and then subjected to a hot rolling process which is started at a temperature around 450° C. (±50° C.). According to this invention on the other hand, an ingot of the aluminum alloy containing the above-described specific amounts of Fe, Si and Cu is most liable to occurrence of precipitation of Al—Fe-based compounds and Al—Fe—Si-based compounds at the temperature around 450° C., Accordingly, if the above-described homogenization treatment and hot rolling process are conducted on the ingot of the aluminum alloy according to this invention at temperatures within the above-descried ranges, an excessively large amount of precipitates are generated, and the electric conductor to be obtained has difficulty to have a sufficiently high degree of strength, even though the electric conductor can have the required degree of electric conductivity.

Therefore, in order to acquire an appropriate balance between the required degrees of electric conductivity and strength as specified in this invention, this invention preferably employs a method of producing the desired aluminum alloy plate by avoiding the temperature within the above-described ranges, in which the precipitation of the Al—Fe-based compounds and Al—Fe—Si-based compounds is most likely to occur. Namely, this invention employs a method of conducting the hot rolling process of the aluminum alloy ingot at the lowest possible temperature required for the hot rolling process, and conducting the homogenization treatment as required before the hot rolling process, at a temperature not higher than the temperature at which the hot rolling process is started.

Therefore, the hot rolling process of the aluminum alloy ingot according to this invention is started at a temperature not higher than 400° C., preferably not higher than 350° C., and terminated at a temperature not higher than a recrystallization temperature, for example, at a temperature around 250° C., whereby the aluminum alloy plate having a desired thickness is produced. The hot rolling process is started at a temperature generally not lower than about 250° C., and terminated at a temperature generally not lower than about 100° C., preferably not lower than about 150° C. If the hot rolling process is terminated at an excessively low temperature, the aluminum alloy ingot cannot have a sufficiently high degree of ductility during the hot rolling process, and defects such as cracked edges are likely to occur.

In the case where the aluminum alloy ingot is subjected to the homogenization treatment before the hot rolling process, the homogenization treatment is conducted by holding the aluminum alloy ingot at a temperature not higher than the above-described temperature at which the hot rolling process is started, for a period of generally about 1-24 hours. The aluminum alloy ingot obtained by the DC casting process or the like may be subjected to the hot rolling process without being subjected to the above-described homogenization treatment.

Further, in the production of the aluminum alloy plate which gives the plate-like electric conductor for the busbar according to this invention, the aluminum alloy plate having a desired thickness can be produced by a method of conducting a cold rolling process with a rolling reduction rate not higher than 50%, after the above-described hot rolling process, in place of the above-described method of conducting only the hot rolling process. By conducting the cold rolling process after the hot rolling process, it is possible to increase the freedom of choice of the thickness of the electric conductor to be obtained. If the cold rolling process is conducted with a rolling reduction rate higher than 50%, there arises a risk that a worked structure is excessively introduced in the aluminum alloy plate, resulting in deterioration of the bendability of the electric conductor. The cold rolling process is preferably finished by one pass, since a cold rolling process conducted by more than one pass undesirably increases the material cost.

In the case where the aluminum alloy plate (plate-like electric conductor) having the desired thickness is produced by a method of conducting a continuous casting-directed rolling process, in place of the above-described method of producing the desired aluminum alloy plate from the ingot of the aluminum alloy according to this invention by the hot rolling process, it is possible to increase a solidification rate of a molten aluminum alloy, and thereby obtaining a material having a higher degree of solid solubility in the as-cast state. However, in such a case, the aluminum alloy plate to be obtained has difficulty to have the required degree of electric conductivity, even though the aluminum alloy plate has a high degree of strength. Therefore, contrary to the above-described method, the aluminum alloy plate to be obtained is subjected to a heat treatment in order to promote the precipitation of the solute components in the aluminum alloy. Generally, the heat treatment for promoting the precipitation is conducted by holding the aluminum alloy plate at a temperature preferably within a range of 400-500° C. for not shorter than 5 hours. Where the heat treatment of the aluminum alloy plate is conducted for longer than 24 hours, it is difficult to expect a further improvement of a precipitation effect, so that the heat treatment is required to be conducted for not longer than 24 hours.

Although an embodiment of this invention has been described for illustration purpose only, it is to be understood that this invention is not limited to the specific description of the embodiment, and may be embodied with various changes, modifications and improvements, which may occur to those skilled in the art, without departing from the spirit and scope of this invention, and that such embodiment is also within the scope of this invention.

EXAMPLES

To further clarify this invention, typical examples of this invention will be described. However, it is to be understood that this invention is not limited to the details of the illustrated examples.

Example 1

Initially, various kinds A to N of aluminum alloys which contain respective chemical components shown in Table 1 given below were cast by a DC casting process into ingots having a thickness of 550 mm and a width of 1,000 mm.

TABLE 1

| Aluminum | Chemical Components (mass %) | | | | | | | | |
|---|---|---|---|---|---|---|---|---|---|
| Alloy | Si | Fe | Cu | Mn | Mg | Cr | Zn | Ti | Al |
| A | 0.05 | 0.55 | 0.08 | 0.01 | <0.01 | <0.01 | <0.01 | 0.02 | Bal. |
| B | 0.60 | 0.52 | 0.12 | <0.01 | <0.01 | <0.01 | <0.01 | 0.03 | Bal. |
| C | 0.22 | 0.05 | 0.15 | 0.01 | <0.01 | <0.01 | <0.01 | 0.03 | Bal. |
| D | 0.35 | 2.00 | 0.23 | 0.01 | <0.01 | <0.01 | 0.01 | 0.02 | Bal. |
| E | 0.11 | 0.65 | 0.01 | <0.01 | 0.01 | <0.01 | <0.01 | 0.01 | Bal. |
| F | 0.34 | 0.45 | 0.35 | <0.01 | <0.01 | 0.01 | <0.01 | 0.02 | Bal. |
| G | 0.02 | 0.41 | 0.15 | <0.01 | <0.01 | <0.01 | <0.01 | 0.01 | Bal. |
| H | 0.71 | 0.63 | 0.14 | <0.01 | <0.01 | 0.01 | <0.01 | 0.02 | Bal. |
| I | 0.46 | 0.03 | 0.25 | 0.01 | <0.01 | 0.01 | <0.01 | 0.03 | Bal. |
| J | 0.23 | 2.50 | 0.07 | <0.01 | <0.01 | <0.01 | <0.01 | 0.02 | Bal. |
| K | 0.16 | 0.44 | <0.01 | <0.01 | 0.01 | <0.01 | 0.01 | 0.01 | Bal. |
| L | 0.28 | 0.53 | 0.47 | <0.01 | 0.01 | <0.01 | <0.01 | 0.03 | Bal. |
| M | 0.45 | 0.52 | 0.12 | 1.1 | <0.01 | <0.01 | <0.01 | 0.01 | Bal. |
| N | 0.56 | 0.24 | 0.05 | <0.01 | 0.61 | <0.01 | <0.01 | 0.01 | Bal. |

Then, the ingots of the respective aluminum alloys A to N were subjected to a homogenization treatment at 350° C. for two hours, and then subjected to a hot rolling process started at 350° C. and terminated at 200° C., whereby various kinds of hot-rolled plates having a thickness of 2.0 mm were obtained. Each of the thus obtained various kinds of hot-rolled plates was measured of its electric conductivity, tensile strength and yield strength, in the as-rolled state at the room temperature, and its bendability in the as-rolled state. Results of the measurement are shown in Table 2 given below. Further, the hot-rolled plates were subjected to an accelerating test in order to evaluate deterioration of their properties due to generation of heat by the Joule heat. In the accelerating test, a heat treatment of each hot-rolled plate was performed by holding each hot-rolled plate at the temperature of 150° C. for 1,000 hours. After the accelerating test, each hot-rolled plate was measured of its electric conductivity, tensile strength and yield strength at the room temperature. Results of the measurement are shown in Table 2 given below.

The electric conductivity of each hot-rolled plate was measured by using a magnetic-induction test coil unit (Sigma tester), and the tensile strength and yield strength of the hot-rolled plate were evaluated by conducting a tensile test. The bendability of each hot-rolled plate was evaluated by conducting a bending test in which the hot-rolled plate was bent by 90° with an inner bending radius of 2.0 mm, since the hot-rolled plate has the thickness of 2.0 mm. If cracking took place in a curved corner of the hot-rolled plate, the bendability of the plate was evaluated as “poor”, and if no cracking took place in the curved corner of the hot-rolled plate, the bendability of the plate was evaluated as “good”.

TABLE 2

| | | Properties in the as-rolled state | | | | Properties after the plate was held at 150° C. for 1,000 hr | | | |
|---|---|---|---|---|---|---|---|---|---|
| Test material | Aluminum Alloy | Electric Conductivity (% IACS) | Tensile Strength (MPa) | Yield Strength (MPa) | Bendability | Electric Conductivity (% IACS) | Tensile Strength (MPa) | Yield Strength (MPa) | Total Evaluation |
| 1 | A | 59 | 171 | 157 | Good | 59 | 165 | 150 | Good |
| 2 | B | 57 | 188 | 170 | Good | 59 | 179 | 159 | Good |
| 3 | C | 60 | 172 | 156 | Good | 60 | 163 | 147 | Good |
| 4 | D | 57 | 186 | 171 | Good | 57 | 176 | 160 | Good |
| 5 | E | 60 | 174 | 158 | Good | 60 | 162 | 146 | Good |
| 6 | F | 55 | 195 | 183 | Good | 57 | 191 | 179 | Good |
| 7 | G | 59 | 155 | 139 | Good | 59 | 150 | 129 | Poor |
| 8 | H | 56 | 196 | 180 | Poor | 58 | 192 | 173 | Poor |
| 9 | I | 60 | 150 | 131 | Good | 61 | 141 | 119 | Poor |
| 10 | J | 55 | 198 | 185 | Poor | 55 | 192 | 178 | Poor |
| 11 | K | 60 | 159 | 148 | Good | 60 | 145 | 123 | Poor |
| 12 | L | 53 | 203 | 192 | Poor | 54 | 201 | 187 | Poor |
| 13 | M | 42 | 182 | 171 | Poor | 43 | 169 | 159 | Poor |
| 14 | N | 57 | 180 | 165 | Poor | 57 | 171 | 152 | Poor |

As is apparent from the results shown in Table 2, all of the hot-rolled plates of test materials Nos. 1 to 6 obtained by using the aluminum alloys A to F containing the chemical components according to this invention have excellent properties of: electric conductivity of 55-60% IACS; tensile strength not lower than 170 MPa; and yield strength not lower than 155 MPa; and absence of cracking when the hot-rolled plates were bent by 90° in the bending test. Further, it was revealed that the hot-rolled plates of the test materials Nos. 1 to 6 have excellent properties of: electric conductivity of 55-60% IACS; tensile strength not lower than 160 MPa; and yield strength not lower than 145 MPa, even after the hot-rolled plates were subjected to the accelerating test to simulate the generation of heat by the Joule heat. Therefore, all of the hot-rolled plates of the test materials Nos. 1 to 6 are evaluated as "good" (non-defective) by total evaluation.

On the other hand, the hot-rolled plates of test materials Nos. 7 to 14 have problems in at least one of their electric conductivity, tensile strength, yield strength and bendability, since the aluminum alloys which give the hot-rolled plates of the test materials Nos. 7 to 14 contain an excessively small or an excessively large amount of any of the chemical components. Therefore, the hot-rolled plates of the test materials Nos. 7 to 14 are evaluated as "poor" (defective) by total evaluation.

More specifically described, the test material No. 7 uses the aluminum alloy G containing less than 0.05% of Si, so that the test material No. 7 cannot exhibit a sufficient effect of increasing the strength of the hot-rolled plate. Accordingly, the hot-rolled plate of the test material No. 7 has an undesirably low degree of tensile strength, which is lower than 170 MPa, and an undesirably low degree of yield strength, which is lower than 155 MPa. Further, the hot-rolled plate of the test material No. 7 has an undesirably low degree of tensile strength, which is lower than 160 MPa, and an undesirably low degree of yield strength, which is lower than 145 MPa, after the heat treatment of the accelerating test.

The test material No. 8 uses the aluminum alloy H containing more than 0.6% of Si, so that Al—Fe—Si-based crystallized products and precipitates of Si were formed. Accordingly, the hot-rolled plate of the test material No. 8 has an undesirably low degree of bendability, and suffered from its cracking when it was bent by 90° in the bending test.

The test material No. 9 uses the aluminum alloy I containing less than 0.05% of Fe, so that the test material No. 9 cannot exhibit a sufficient effect of increasing the strength of the hot-rolled plate. Accordingly, the hot-rolled plate of the test material No. 9 has an undesirably low degree of tensile strength, which is lower than 170 MPa, and an undesirably low degree of yield strength, which is lower than 155 MPa. Further, the hot-rolled plate of the test material No. 9 has an undesirably low degree of tensile strength, which is lower than 160 MPa, and an undesirably low degree of yield strength, which is lower than 145 MPa, after the heat treatment of the accelerating test. The test material No. 10 uses the aluminum alloy J containing more than 2.0% of Fe, so that Al—Fe—Si-based and Al—Fe-based crystallized products and precipitates were formed. Accordingly, the hot-rolled plate of the test material No. 10 has an undesirably low degree of bendability, and suffered from its cracking when it was bent by 90° in the bending test.

The test material No. 11 uses the aluminum alloy K containing less than 0.01% of Cu, so that the test material No. 11 cannot exhibit a sufficient effect of increasing the strength of the hot-rolled plate. Accordingly, the hot-rolled plate of the test material No. 11 has an undesirably low degree of tensile strength, which is lower than 170 MPa, and an undesirably low degree of yield strength, which is lower than 155 MPa. Further, the hot-rolled plate of the test material No. 11 has an undesirably low degree of tensile strength, which is lower than 160 MPa, and an undesirably low degree of yield strength, which is lower than 145 MPa, after the heat treatment of the accelerating test. The test material No. 12 uses the aluminum alloy L containing more than 0.35% of Cu, so that the hot-rolled plate of the test material No. 12 has an undesirably low degree of electric conductivity, which is 53% IACS, Further, the hot-rolled plate of the test material No. 12 is liable to formation of a shear band, and has an undesirably low degree of bendability. Accordingly, the hot-rolled plate of the test material No. 12 suffered from its cracking when it was bent by 90° in the bending test.

The test material No. 13 uses the aluminum alloy M (which corresponds to an A 3003 alloy) containing 1.1% of Mn, so that the hot-rolled plate of the test material No. 13 has an undesirably low degree of electric conductivity, which is lower than 55% IACS. Further, Al—Mn—Si-based crystallized products and precipitates were formed, so that the hot-rolled plate of the test material No. 13 has an undesirably low degree of bendability, and suffered from its cracking when it was bent by 90° in the bending test.

The test material No. 14 uses the aluminum alloy N (which corresponds to an A 6063 alloy) containing 0.61% of Mg, so that Mg—Si-based crystallized products and precipitates were formed. Accordingly, the hot-rolled plate of the test material No. 14 has an undesirably low degree of bendability and suffered from its cracking when it was bent by 90° in the bending test.

Example 2

Initially, a molten aluminum alloy having a composition of: 0.45% of Si; 0.72% of Fe; 0.25% of Cu; and a balance comprising Al and inevitable impurities was prepared, and cast by the DC casting process into an ingot having a thickness of 550 mm and a width of 1,000 mm, as in Example 1.

Then, the thus obtained aluminum alloy ingot was subjected to a rolling operation under various conditions of the homogenization treatment, hot rolling process, and cold rolling process as indicated in Table 3 given below, whereby various test materials (plate materials) having a thickness of 2.0 mm were obtained. Each of the thus obtained test materials was measured of its electric conductivity, tensile strength, yield strength and bendability, in the as-rolled state, and after the heat treatment of the accelerating test, as in Example 1. Results of the measurement are shown in Table 4 given below.

TABLE 3

| | Homogenization Treatment | | Hot Rolling Process | | Cold Rolling Process | |
|---|---|---|---|---|---|---|
| | | | Starting | Terminating | | |
| Test Material | Temperature (° C.) | Time (hr) | Temperature (° C.) | Temperature (° C.) | Rolling Reduction Rate (%) | Pass |
| 15 | — | — | 370 | 230 | — | — |
| 16 | 350 | 4 | 380 | 200 | — | — |
| 17 | 350 | 2 | 350 | 220 | 30 | 1 |
| 18 | 370 | 1 | 370 | 250 | 40 | 1 |
| 19 | 450 | 2 | 380 | 200 | — | — |
| 20 | 450 | 2 | 450 | 220 | — | — |
| 21 | — | — | 470 | 230 | — | — |
| 22 | 500 | 3 | 500 | 300 | — | — |
| 23 | 350 | 2 | 380 | 200 | 60 | 1 |

TABLE 4

| | Properties in the as-rolled state | | | | Properties after the plate was held at 150° C. for 1,000 hr | | | |
|---|---|---|---|---|---|---|---|---|
| Test material | Electric Conductivity (% IACS) | Tensile Strength (MPa) | Yield Strength (MPa) | Bendability | Electric Conductivity (% IACS) | Tensile Strength (MPa) | Yield Strength (MPa) | Total Evaluation |
| 15 | 58 | 186 | 173 | Good | 59 | 179 | 161 | Good |
| 16 | 60 | 181 | 169 | Good | 60 | 173 | 159 | Good |
| 17 | 59 | 192 | 180 | Good | 60 | 181 | 168 | Good |
| 18 | 59 | 203 | 189 | Good | 60 | 189 | 173 | Good |
| 19 | 61 | 165 | 142 | Good | 62 | 160 | 135 | Poor |
| 20 | 61 | 158 | 140 | Good | 61 | 149 | 129 | Poor |
| 21 | 58 | 168 | 156 | Good | 59 | 155 | 143 | Poor |
| 22 | 62 | 149 | 132 | Good | 62 | 140 | 121 | Poor |
| 23 | 59 | 215 | 193 | Poor | 59 | 201 | 189 | Poor |

As is apparent from the results shown in Tables 3 and 4, where the homogenization treatment, hot rolling process and cold rolling process were conducted under the conditions according to this invention, all of the obtained test materials have high degrees of electric conductivity, tensile strength, yield strength and bendability, and the required degrees of these properties as specified in this invention are maintained even after the test materials were subjected to the heat treatment of the accelerating test.

On the other hand it was recognized that sufficiently high degrees of properties desired by this invention cannot be achieved where the temperature of the homogenization treatment, or the starting temperature or the terminating temperature of the hot rolling process was excessively high, or the rolling reduction rate of the cold rolling process was excessively high.

The invention claimed is:

1. A plate-like electric conductor for a busbar formed from an aluminum alloy plate having a thickness (T) of 0.5-12 mm obtained by using an aluminum alloy consisting essentially of 0.05-2.0% by mass of Fe, 0.05-0.6% by mass of Si, 0.01-0.35% by mass of Cu, and a balance comprising Al and inevitable impurities, and subjecting the aluminum alloy to a hot rolling process so as to obtain the plate-like electric conductor having an electric conductivity of 55-60% IACS, in an as-rolled state at the room temperature, wherein the plate-like electric conductor has a tensile strength not lower than 170 MPa and a yield strength not lower than 155 MPa, in the as-rolled state at the room temperature, and the plate-like electric conductor does not suffer from cracking when the plate-like electric conductor is bent by 90° with an inner bending radius equal to said thickness (T), and wherein the plate-like electric conductor has the electric conductivity of 55-60% IACS, the tensile strength not lower than 160 MPa, and the yield strength not lower than 145 MPa, at the room temperature, after a heat treatment in which the plate-like electric conductor is held at a temperature of 140-160° C. for not longer than 1,000 hours.

2. The plate-like electric conductor according to claim 1, wherein the aluminum alloy contains 0.1-1.6% by mass of Fe.

3. The plate-like electric conductor according to claim 1, wherein the aluminum alloy contains 0.05-0.5% by mass of Si.

4. The plate-like electric conductor according to claim 1, wherein the aluminum alloy contains 0.05-0.30% by mass of Cu.

5. The plate-like electric conductor according to claim 1, wherein the aluminum alloy contains not more than 0.15% by mass of the inevitable impurities.

6. The plate-like electric conductor according to claim 1, wherein the aluminum alloy plate has the thickness of 0.5-8 mm.

7. A busbar consisting of a plate-like electric conductor according to claim 1.

* * * * *